(12) United States Patent
Yoshida et al.

(10) Patent No.: US 7,538,448 B2
(45) Date of Patent: May 26, 2009

(54) POWER SUPPLY CIRCUIT STRUCTURE COMPRISING A CURRENT SENSOR, AND METHOD OF ASSEMBLING THE SAME

(75) Inventors: Noriyuki Yoshida, Mie (JP); Hiroyuki Wakamatsu, Aichi (JP); Yosuke Okamoto, Aichi (JP)

(73) Assignees: Sumitomo Wiring Systems, Ltd., Mie (JP); Toyota Auto Body Co., Ltd., Kariya (JP)

( * ) Notice: Subject to any disclaimer, the term of this patent is extended or adjusted under 35 U.S.C. 154(b) by 141 days.

(21) Appl. No.: 11/806,405

(22) Filed: May 31, 2007

(65) Prior Publication Data

US 2007/0285864 A1    Dec. 13, 2007

(30) Foreign Application Priority Data

Jun. 8, 2006    (JP)    ............................. 2006-160101

(51) Int. Cl.
  *B60L 5/00*    (2006.01)
(52) U.S. Cl. ........................ 307/9.1; 307/10.1; 361/600; 361/601; 361/627; 361/637
(58) Field of Classification Search ................ 307/10.1; 361/600, 601, 627, 637

See application file for complete search history.

(56) References Cited

U.S. PATENT DOCUMENTS

| | | | | |
|---|---|---|---|---|
| 6,864,598 | B2 * | 3/2005 | Nogaret et al. | 307/10.1 |
| 6,923,279 | B2 * | 8/2005 | Shimane et al. | 180/65.1 |
| 6,984,783 | B2 * | 1/2006 | Kusumi et al. | 174/50 |
| 7,289,343 | B2 * | 10/2007 | Rodriguez et al. | 363/146 |
| 2006/0057899 | A1 | 3/2006 | Tokunaga | |

FOREIGN PATENT DOCUMENTS

| | | |
|---|---|---|
| JP | A 2005-129379 | 5/2005 |
| JP | A 2006-85945 | 3/2006 |

* cited by examiner

*Primary Examiner*—Albert W Paladini
(74) *Attorney, Agent, or Firm*—Oliff & Berridge, PLC

(57) ABSTRACT

A power supply circuit structure includes: a first bus bar in which a power supply side terminal that is to be connected with a power supply post protruded from a DC/DC converter is disposed in one end side, a current sensor passing portion is disposed on another end side, and an output terminal portion is disposed at the tip end of the current sensor passing portion; and a second bus bar having an input terminal portion which is to be connected with the output terminal portion of the first bus bar, and an output terminal portion which is to be connected with a terminal of a power supply wire end, and which is on another end side.

7 Claims, 6 Drawing Sheets

POWER SUPPLY CIRCUIT STRUCTURE COMPRISING A CURRENT SENSOR, AND METHOD OF ASSEMBLING THE SAME

BACKGROUND OF THE INVENTION

The present invention relates to a power supply circuit structure comprising a current sensor, and a method of assembling the structure, and more particularly to a structure in which a current sensor is added to a power supply circuit configured by a bus bar that is to be connected with a power supply post of a DC/DC converter mounted on a hybrid vehicle.

In a conventional gasoline automobile, usually, a battery of 12 V and an alternator are mounted as a power supply. As shown in FIG. 6, a battery terminal 2 connected with a power supply wire end is fastened and connected with a battery post 1a protruded from the upper face of a battery 1, and a current generated by an alternator is supplied to the battery (see JP-A-2005-129379).

A structure in which a current sensor is attached to the battery terminal 2 is disclosed in JP-A-2006-85945. In the structure, as shown in FIG. 7, a current sensor 10 is attached onto the battery terminal 2 placed on the upper face of the battery 1, and the flow of a current is measured by the current sensor 10.

[Patent Reference 1] JP-A-2005-129379

[Patent Reference 2] JP-A-2006-85945

In a hybrid vehicle which is recently provided, a DC/DC converter is mounted in place of an alternator. In the DC/DC converter, a power supply post is laterally protruded from one vertical end face, and a power supply circuit is connected with the power supply post. This structure is different from the connection structures of FIGS. 6 and 7 between the battery and the power supply circuit.

Unlike the prior art, therefore, a current sensor attached to the power supply circuit cannot be placed on the upper face of the battery. It is requested to enable the current sensor to be placed in a narrow space between the DC/DC converter and a cradle for the converter.

SUMMARY OF THE INVENTION

The invention satisfies the request. It is an object of the invention that, in a power supply circuit configured by a bus bar that is to be connected with a DC/DC converter in a hybrid vehicle, the bus bar can be placed with high workability and at high efficiency in a narrow space between the DC/DC converter and a cradle for the converter, and a current sensor can be attached to the bus bar.

In order to attain the object, there is provided a power supply circuit structure to be connected with a DC/DC converter mounted on a hybrid vehicle, including:

a current sensor;

a first bus bar including:

a power supply side terminal connected with a power supply post protruded from the DC/DC converter, the power supply side terminal being disposed on one end side, a current sensor passing portion disposed on the other end side, and an output terminal portion disposed on a tip end of the current sensor passing portion; and a second bus bar including:

an input terminal portion connected with the output terminal portion of the first bus bar, and an output terminal portion connected with a terminal of a power supply wire end, the output terminal portion being disposed on the other end side, wherein the first bus bar is housed in a case made of an insulating resin, the power supply side terminal and the current sensor passing portion are exposed from the case, the second bus bar is fixed to a support table made of an insulating resin, and the support table and the case are coupled to each other when the output terminal portion of the first bus bar and the input terminal portion of the second bus bar are connected with each other.

In the thus configured power supply circuit structure, the first bus bar in which the one end is to be connected with the DC/DC converter, and the current sensor is attached to the other end side, and the second bus bar which is connected with the terminal of the power supply wire end are separately disposed. Therefore, the workability of attachment of the DC/DC converter, the current sensor, and the terminal of the power supply wire end can be improved, and the current sensor for measuring the current value of the first bus bar which is directly attached to the DC/DC converter can be easily set to the first bus bar.

Preferably, the first bus bar has a rectangular shape, only the first bus bar is housed in the case, one end of the first bus bar protruded from the case is bent to dispose the power supply side terminal, the other end of the first bus bar protruded from the case is bent in an opposite direction to dispose the current sensor passing portion, the case housing the first bus bar is placed in an elongate space which is formed between a side face of the DC/DC converter and a side wall of a cradle, the support table for fixing the second bus bar has a rectangular shape, and the input terminal portion at the tip end of the second bus bar on the support table is connected with the bent tip end of the current sensor passing portion of the first bus bar, to place the case and the support table in parallel in the space.

As described above, the case housing the first bus bar in which the one end is to be connected with the DC/DC converter, and the current sensor is attached to the other end side, and the support table to which the second bus bar that is shorter than the case is fixed are separately disposed, and, after the current sensor is attached to the first bus bar, coupled to each other and placed in parallel. Therefore, the first bus bar, the second bus bar, and the current sensor can be housed with high workability and at high efficiency in the elongate space between the DC/DC converter and the cradle for the converter.

In the invention, preferably, the structure further includes:

a protective cover which covers a connecting portion between the first bus bar and the second bus bar, and a connecting portion between the second bus bar and the terminal of the power supply wire end.

When conductive portions connected with the DC/DC converter are covered by the protective cover in this way, safety such as short-circuit prevention can be ensured.

Preferably, the power supply side terminal of the first bus bar is provided with a mounting hole through which the threaded post of the DC/DC converter is to be passed, the post is connected with the power supply side terminal by passing the post through the mounting hole and fastening by a nut, and a cap portion which covers a connecting portion of the post and the power supply side terminal after the connection is provided on the case.

In this way, also the electrical connecting portion between the power supply post of the DC/DC converter and the power supply side terminal of the first bus bar is covered by the protective cap, whereby safety can be assured. Since the protective cap is integrated with the case, moreover, the number of components can be reduced, and omission of attachment of the protective cap can be prevented from occurring.

Preferably, a clip is protruded from one of the case housing the first bus bar and the support table for fixing the second bus bar, an engagement hole with which the clip is inserted and engaged is provided on the other of the case housing the first bus bar and the support table for fixing the second bus bar, and when the output terminal portion of the first bus bar and the input terminal portion of the second bus bar are connected with each other, the clip is inserted and engaged with the engagement hole and the case and the support table are coupled.

When the first and second bus bars are fastened with each other, the case housing the first bus bar, and the support table to which the second bus bar is fixed are coupled to each other by the clip, whereby the workability of an operation of fastening together the bus bars can be enhanced.

In the case where a terminal portion is protruded from the current sensor, preferably, a terminal portion protruded from the current sensor overlaps with the output terminal portion of the first bus bar and the input terminal portion of the second bus bar, and the three terminal portions are connected with one another.

When the terminal portion of the current sensor is stacked and fastened together with the connecting portion between the output terminal portion of the first bus bar, and the input terminal portion of the second bus bar, the labor in the step of the fastening work can be saved. Since fastening places are reduced, moreover, the power supply circuit structure can be simplified.

Further, there is provided a method of assembling the power supply circuit structure including a current sensor, the method including the steps of:

separately setting the case housing the first bus bar, and the support table to which the second bus bar is fixed, without coupling to each other, connecting the power supply side terminal of the first bus bar with the post of the DC/DC converter, attaching the current sensor passing over the current sensor passing portion from a side of the output terminal portion to be attached to the first bus bar, coupling the case and the support table to each other after the current sensor is attached, and connecting the output terminal portion of the first bust bar and the input terminal portion of the second bus bar with each other, connecting the terminal of the power supply wire end with the output terminal portion of the second bus bar, and putting a protective cover on exposed conductive portions after the electrical connection.

Usually, connection of a power supply circuit to which a current sensor for a DC/DC converter is attached, and attachment of the DC/DC converter and the power supply circuit to an automobile are performed in the following manner. The power supply circuit configured by a bus bar is produced by a wiring harness manufacturer, attachment of the DC/DC converter and the current sensor to the power supply circuit is performed by an electric appliance manufacturer, and a step of placing the power supply circuit to which the DC/DC converter and the current sensor have been added, in an automobile, and connecting the circuit with a power supply wire is performed by an automobile manufacturer.

In this way, the assembly is performed by different manufacturers. Therefore, the power supply circuit structure of the invention is configured in accordance with the procedure of the assembly work, and hence the assembly workability in each manufacturer is enhanced.

As described above, according to the power supply circuit structure comprising a current sensor of the invention, in a power supply circuit configured by a bus bar that is to be connected with a DC/DC converter mounted on a hybrid vehicle, the current sensor can be easily attached to the bus bar, and can be efficiently placed in a narrow space between the DC/DC converter and the cradle for the converter.

Particularly, the structure where the bus bar constituting the power supply circuit is divided into the first bus bar to be connected with the DC/DC converter, and the second bus bar to be connected with the terminal of the power supply wire end, and, after the current sensor is attached to the first bus bar, the first and second bus bars are connected with each other is employed.

Therefore, the current sensor can be attached with high workability to the power supply circuit.

DETAILED DESCRIPTION OF THE PREFERRED EMBODIMENTS

Hereinafter, an embodiment of the invention will be described in detail with reference to the accompanying drawings.

Figure 1A:
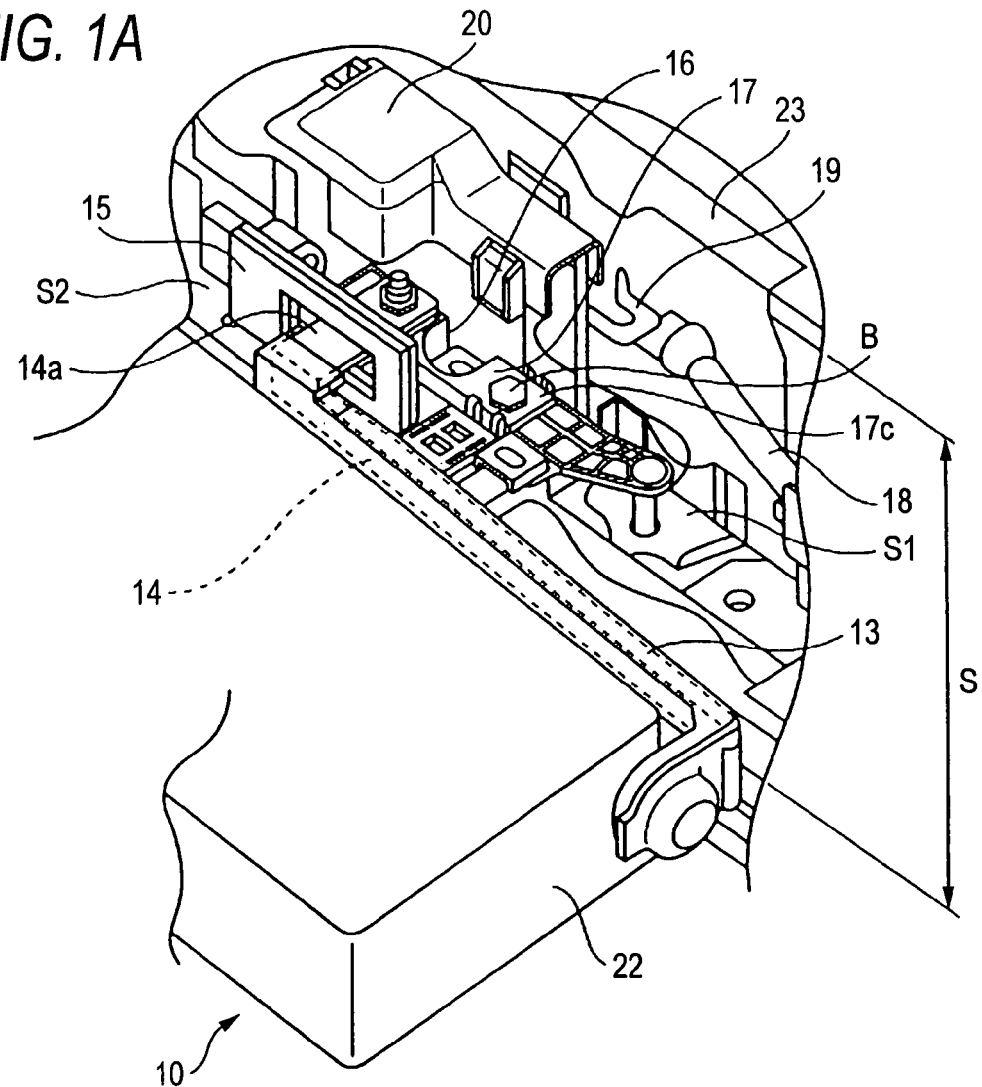
FIG. 1A is a perspective view showing an embodiment of the invention.
Figure 1B:
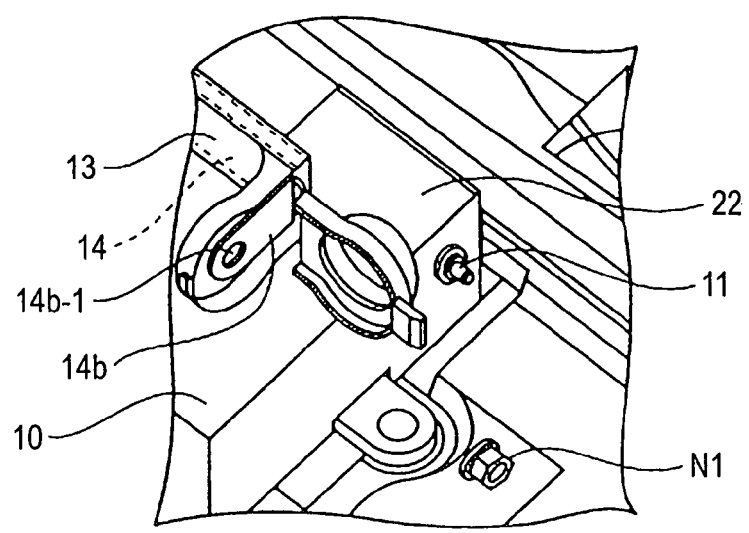
FIG. 1B is an exploded perspective view enlargedly showing main portions of FIG. 1A.
Figure 2A:
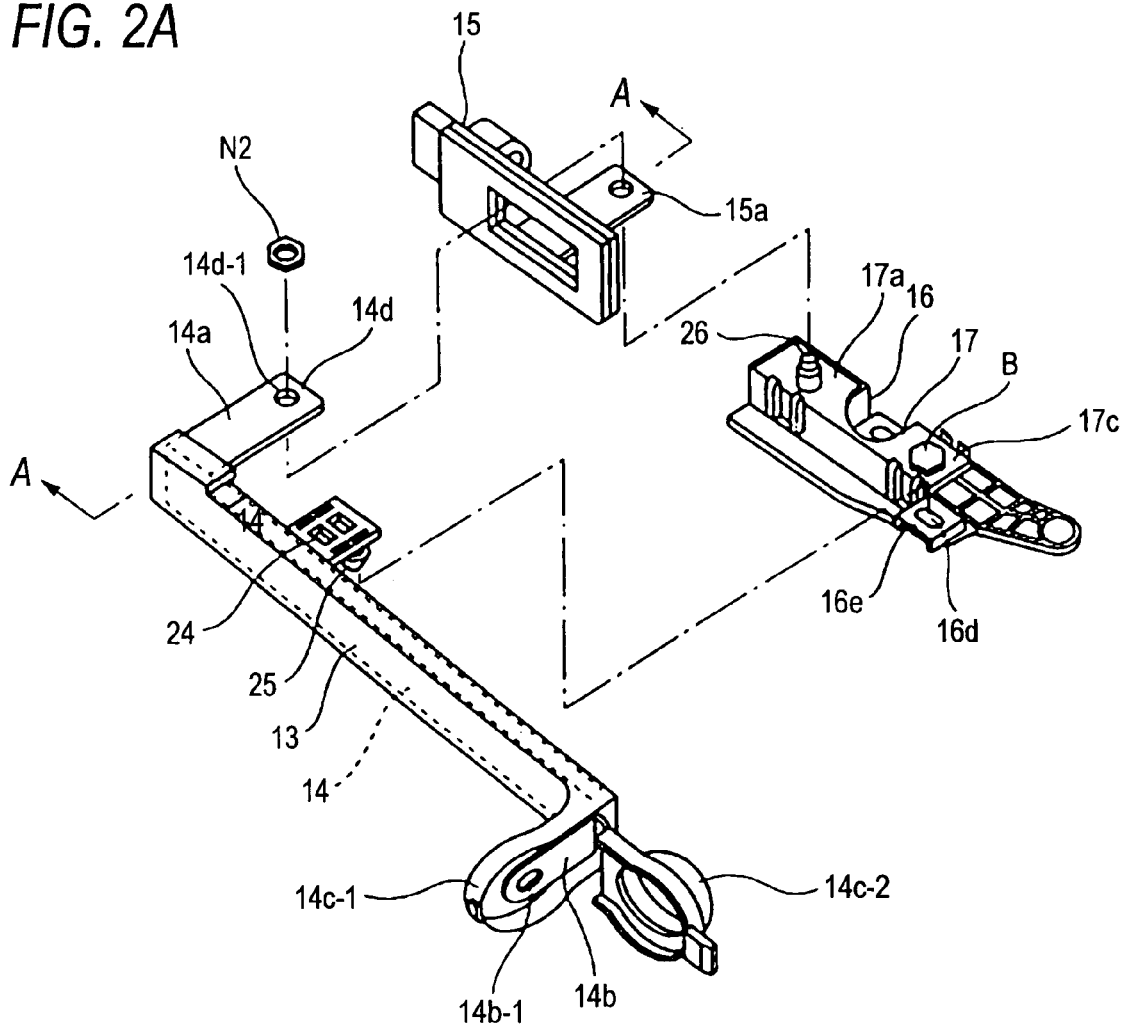
FIG. 2A is an exploded perspective view of FIG. 1.

FIGS. 1A and 1B are perspective views showing a DC/DC converter 10 mounted on a hybrid vehicle, and a power supply circuit connected with a power supply post 11 of the DC/DC converter 10, and FIG. 2A is an exploded perspective view.

A first bus bar 14 housed in a case 13 made of an insulating resin is connected with the power supply post 11 of the DC/DC converter 10. After the first bus bar 14 is passed through a current sensor 15, a second bus bar 17 fixed onto a support table made of an insulating resin is connected with the first bus bar. A terminal 19 connected with an end of a power supply wire 18 is connected with the second bus bar 17. Thereafter, the current sensor 15, exposed portions of the first bus bar 14 and the second bus bar 17, the second bus bar 17, and the terminal 19 of the power supply wire end are collectively enclosed and protected by a protective cover 20.

In the DC/DC converter 10, as shown in FIGS. 1A and 1B, a battery case 22 having a rectangular parallelepiped or cylindrical shape is horizontally mounted on a cradle 23, and the power supply post 11 is protruded from the side of one end face of the case. An elongate space S exists between a side face of the battery case 22 and the cradle 23. Below a position inside the space S and on the side of the power supply post 11, a protrusion (not shown) where the current sensor 15 cannot be disposed is protruded from the cradle 23.

Inside the space S, the rectangular case 13 housing the first bus bar 14, and a support table 16 to which the second bus bar 17 is fixed are placed in parallel. The power supply wire 18 is laid above the protrusion which is protruded from the lower side, and inserted into one end side S1 in the length direction of the space S. On the other hand, in the other end side S2, a current sensor passing portion 14a which is disposed by bending the first bus bar 14 is passed through the current sensor 15, and the tip end of the first bus bar 14 which has been passed through the current sensor is connected with the second bus bar 17.

Hereinafter, the above components will be described in detail.

Figure 3A:
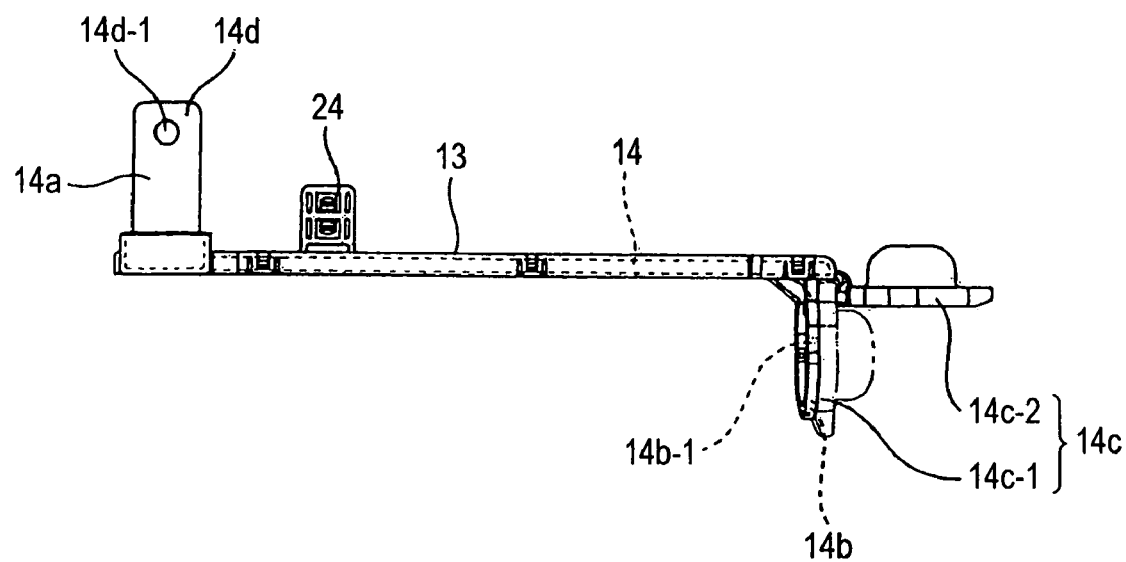
FIG. 3A is a front view showing a case housing a first bus bar.
Figure 3B:
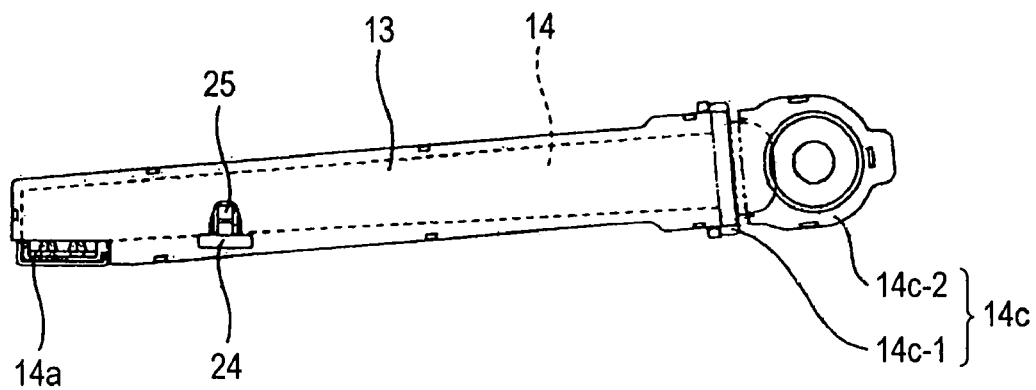
FIG. 3B is a plan view.

As shown in FIGS. 3A and 3B, the case 13 houses the first bus bar 14 in such a manner that only the elongate first bus bar 14 is embedded, and a power supply side terminal 14b of the first bus bar 14 is protruded from one end side of the case. The power supply side terminal 14b comprises a mounting hole 14b-1 through which the power supply post 11 of the DC/DC converter 10 is to be passed, and is to be electrically connected with the power supply post by fastening a nut N1 with a male thread formed on the outer peripheral face of the power supply post 11, in a state where the power supply post 11 is passed through the mounting hole 14b-1. In order to protect the connecting portion between the power supply side terminal 14b and the power supply post 11, a protective cap 14c is protruded from one end of the case 13. The protective cap 14c is configured so that an annular seat portion 14c-1 and a cap portion 14c-2 are coupled to each other via a thin hinge portion, and, in a state where the seat portion 14c-1 is attached to the outer periphery side of the power supply post 11, a nut is fastened, and thereafter the cap portion 14c-2 is put on to be locked with the seat portion.

In the side of the other end of the case 13, the first bus bar 14 is protruded from the case 13 while bent in a direction opposite to the power supply side terminal 14b. The bent portion is used as the current sensor passing portion 14a, the tip end of the portion is used as an output terminal portion 14d to be connected with the second bus bar 17, and a bolt hole 14d-1 is disposed in the portion. A connecting portion 24 in which a clip 25 to be engaged with the support table 16 of the second bus bar 17 is disposed is protruded from a side face of the case 13.

The current sensor passing portion 14a of the first bus bar 14 is inserted into the current sensor 15 having a substantially O-like frame shape, from the side of the output terminal portion 14d at the tip end, and the current sensor is disposed so as to surround the current sensor passing portion 14a. A terminal portion 15a having a hole is protruded from the current sensor 15, and placed so as to butt against the lower face of the output terminal portion 14d of the first bus bar 14.

Figure 2B:
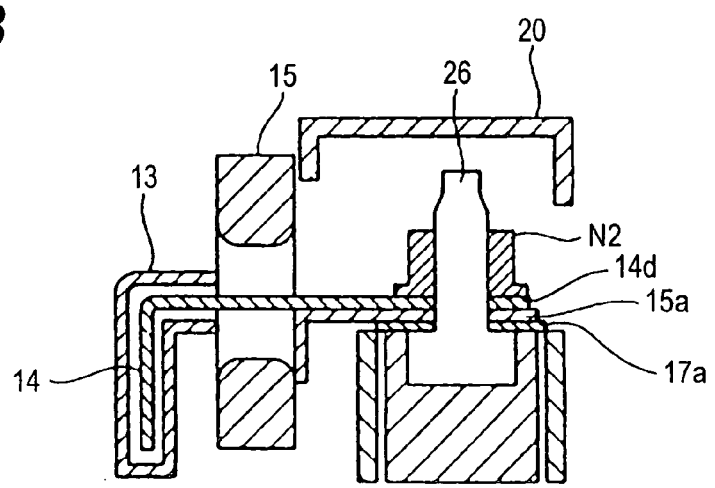
FIG. 2B is a sectional view of an assembled state of FIG. 2A taken along the line A-A.
Figure 4A:
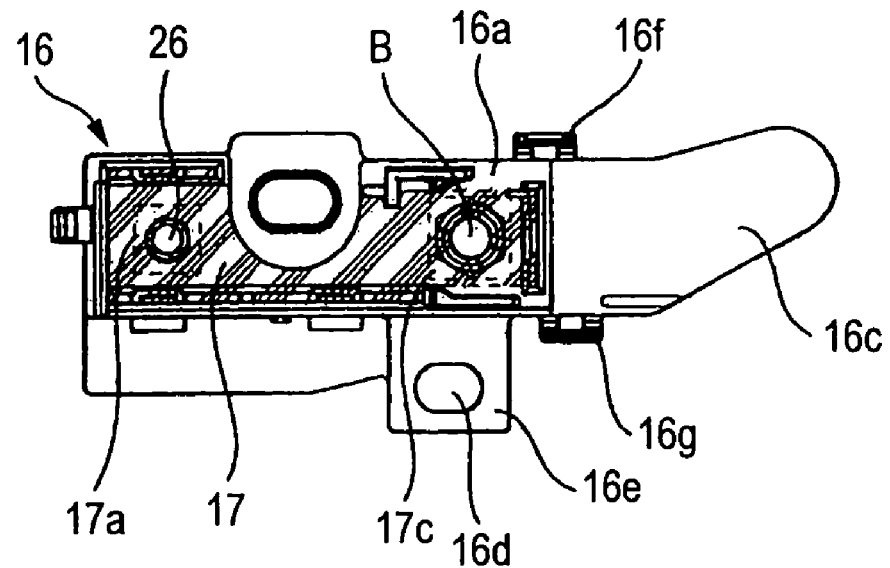
FIG. 4A is a plan view showing a support table to which a second bus bar is fixed.
Figure 4B:
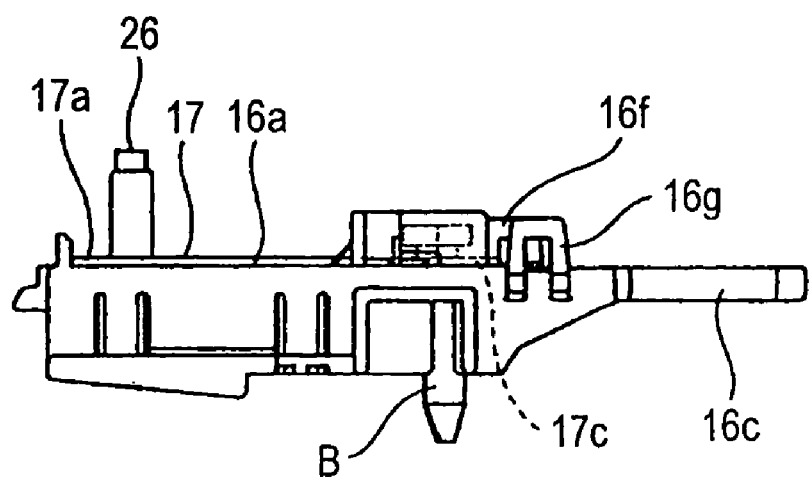
FIG. 4B is a front view.

The second bus bar 17, and the support table 16 in which the second bus bar 17 is fixed to the upper face are configured as shown in FIGS. 4A and 4B. On one side of the second bus bar 17 fixed to the upper face 16a of the support table 16, a shaft portion 26 of a bolt embedded in the support table 16 is protruded to be formed as an input terminal portion 17a. As shown in FIG. 2B, the input terminal portion 17a butts against the lower face of the terminal portion 15a of the current sensor 15 so that the bolt shaft portion 26 is protruded through the holes of the terminal portion 15a and the output terminal portion 14d, and a nut N2 is fastened from the upper side to connect in a three-stack state the output terminal portion 14d of the first bus bar 14, the terminal portion 15a of the current sensor 15, and the input terminal portion 17a of the second bus bar 17 with one another.

The other side of the second bus bar 17 is set to a temporarily fastened state by a nut (not shown) embedded in the support table 16, and a bolt B, the terminal 19 connected with the end of the power supply wire 18 is inserted in the nut by sliding the terminal laterally with respect to the bolt B in the temporarily fastened state, and then the bolt B is finally fastened to electrically connect the bus bar with the terminal 19 connected with the end of the power supply wire 18.

The support table 16 is further extended than an output terminal portion 17c of the second bus bar 17 to dispose an extended portion 16c, and the extended portion 16c is used as a placement portion for the power supply wire 18. A coupling portion 16e is protruded from a side face of the support table 16. In the coupling portion, an engagement hole 16d with which the clip 25 protruded from the case 13 is inserted and engaged is disposed. Locking portions 16f, 16g for the protective cover 20 are protruded from side faces of one and other ends of the support table 16.

Figure 5A:
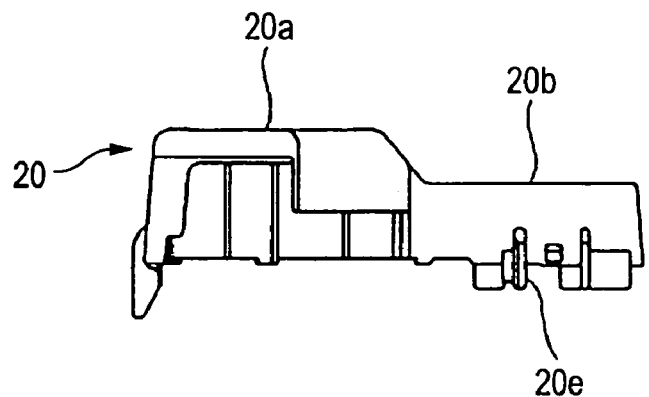
FIG. 5A is a plan view showing a protective cover.
Figure 5B:
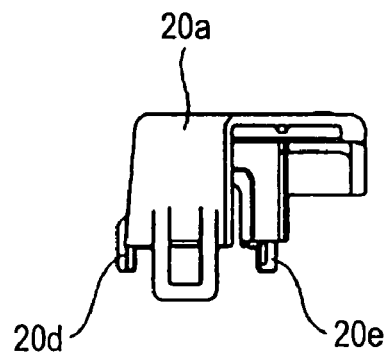
FIG. 5B is a left side view.
Figure 5C:
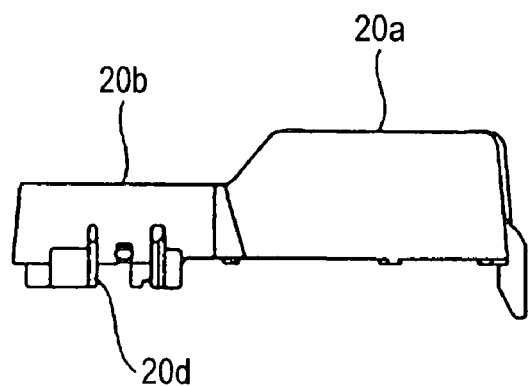
FIG. 5C is a rear view.
Figure 6:
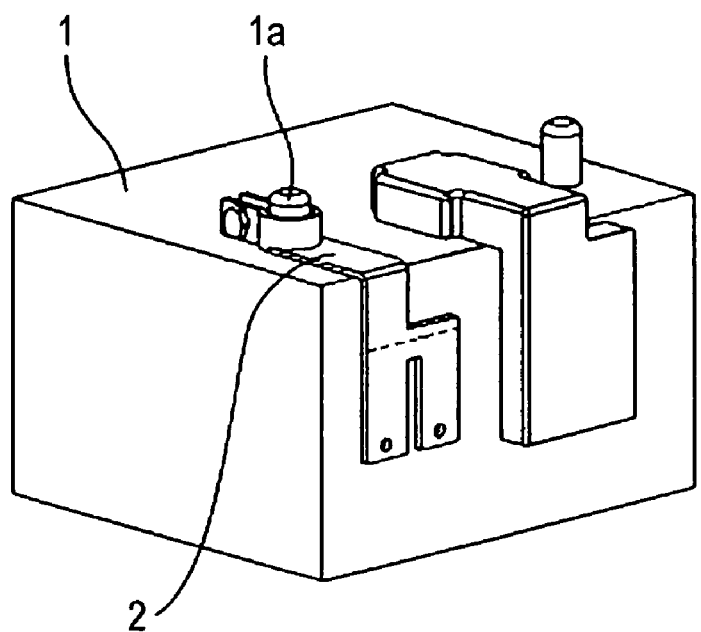
FIG. 6 is a view showing a prior art example.
Figure 7:
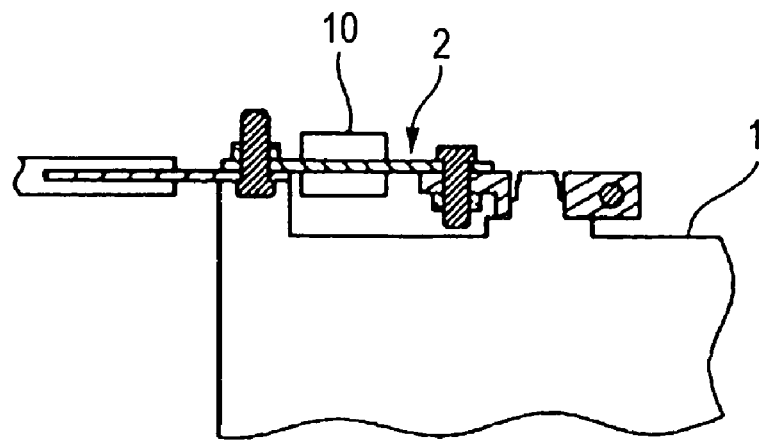
FIG. 7 is a view showing another prior art example.

As shown in FIGS. 5A to 5C, the protective cover 20 has a shape which has upper and peripheral walls, and which is opened in the lower face. A large-width portion 20a surrounding a connecting portion between the first bus bar 14 and the second bus bar 17 is disposed in one side portion, and a small-width portion 20b which covers the second bus bar 17 on the support table 16 and a connecting portion between the second bus bar 17 and the terminal 19 of the power supply wire end is continuously disposed in another side portion.

A locked portion 20d to be coupled to the locking portion 16f of the support table 16 is disposed on the lower face of the peripheral wall at the tip end of the large-width portion 20a, and a locked portion 20e to be coupled to the locking portion 16g of the support table 16 is disposed on the lower faces of the peripheral walls on both sides of the small-width portion 20b.

Next, a method of assembling the components will be described.

First, the assembly flow of the embodiment will be schematically described. The case 13 housing the first bus bar 14, and the support table 16 to which the second bus bar 17 is fixed are produced by a wiring harness manufacturer. In a state where the components are not coupled to each other or are separated from each other, by a manufacturer of the DC/DC converter 10 and the current sensor 15, one end side of the first bus bar 14 is connected with the DC/DC converter 10, the current sensor 15 is attached to the other end side, and, after the attachment of the current sensor 15, the first bus bar 14 and the second bus bar 17 are connected with each other.

In this state, by an automobile manufacturer, the DC/DC converter 10 is mounted on an automobile, and the terminal 19 of the power supply wire 18 is connected with the second bus bar 17. In this way, the components are assembled by different manufacturers.

Hereinafter, assembly of the components will be described in detail.

First, from the side of the output terminal portion 14d, the current sensor 15 is passed over the first bus bar 14 of the case 13 which is not coupled to the support table 16, the current sensor 15 is set to the current sensor passing portion 14a, and the terminal portion 15a is set to the lower face of the output terminal portion 14d.

Thereafter, the tip end of the support table 16 is placed below the terminal portion 15a, the support table 16 is placed in parallel with the case 13, and the clip 25 of the case 13 is inserted and engaged with the engagement hole 16*d* of the support table 16, whereby the case 13 and the support table 16 are coupled to each other.

In this state, the input terminal portion 17*a* of the second bus bar 17 butts against the lower face of the terminal portion 15*a*, and the bolt shaft 26 is protruded while being passed through the holes of the terminal portion 15*a* and the output terminal portion 14*d*. The nut N2 is fastened from the upper side to the bolt shaft 26 to electrically connect in a three-stack state the output terminal portion 14*d* of the first bus bar 14, the terminal portion 15*a* of the current sensor 15, and the input terminal portion 17*a* of the second bus bar 17 with each other.

Then, the case 13 and support table 16 which are coupled to each other as described above are inserted into the space S between the DC/DC converter 10 and the cradle 23. At this time, the side where the current sensor 15 is attached is placed in the side of S1 opposite to the post 11 of the DC/DC converter 10, and the power supply side terminal 14*b* of the first bus bar 14 is positioned at S2 on the side of the post 11.

In this state, the post 11 of the DC/DC converter 10 is passed through the hole of the power supply side terminal 14*b* of the first bus bar 14, and they are fastened together by using the nut N1, whereby the DC/DC converter 10 and the first bus bar 14 are electrically connected with each other. Thereafter, the seat portion 14*c*-1 of the protective cap 14*c* protruded from the case 13 is set on the side of the post 11, and the cap portion 14*c*-2 is put so as to cover the nut N1, whereby the electrical connecting portion is protected by the protective cap 14*c*.

In the state where the first bus bar 14 is connected with the DC/DC converter 10, the current sensor 15 is attached to the first bus bar 14, and the second bus bar 17 is coupled thereto in this way, the DC/DC converter 10 is mounted and incorporated into the body of an automobile.

Next, the power supply wire 18 which is laid in the automobile is placed on the support table 16, the terminal 19 of the end of the line is disposed on the output terminal portion 17*c* of the second bus bar 17, the terminal 19 is inserted by sliding with respect to the bolt B in the temporarily fastened state, and then the bolt B is finally fastened to electrically connect the second bus bar 17 with the power supply wire 18.

After the electrical connection, the protective cover 20 is put on, the locked portions 20*d*, 20*e* of the protective cover 20 are lockingly coupled to the locking portions 16*f*, 16*g* of the support table 16, so that the electrical connecting portion between the output terminal portion 14*d* of the first bus bar 14 and the input terminal portion 17*a* of the second bus bar 17, the second bus bar 17 on the support table 16, and the electrical connecting portion between the output terminal portion 17*c* of the second bus bar 17 and the terminal 19 of the power supply wire end are covered and protected by the protective cover 20.

In the thus configured power supply circuit to be connected with the DC/DC converter 10, the first bus bar 14 to which the current sensor 15 can be added, and the second bus bar 17 can be efficiently housed in the elongate space S between the DC/DC converter 10 and the cradle 23 for the converter.

Since the bus bar is divided into the first bus bar 14 and the second bus bar 17, the current sensor 15 can be attached to the bus bar placed in the space S.

Since the bus bar is divided into the first bus bar 14 and the second bus bar 17, the works of connection with the DC/DC converter 10, and that with the terminal 19 of the end of the power supply wire 18 can be easily performed, and the assembly workability can be improved.

Since all portions which are conductive with the power supply side terminal 14*b* connected with the DC/DC converter 10 are covered and protected by the protective cover 20, a short circuit and the like are prevented from occurring, whereby safety can be enhanced.

What is claimed is:

1. A power supply circuit structure to be connected with a DC/DC converter mounted on a hybrid vehicle, comprising:
    a current sensor;
    a first bus bar including:
        a power supply side terminal connected with a power supply post protruded from the DC/DC converter, the power supply side terminal being disposed on one end side,
        a current sensor passing portion disposed on the other end side, and
        an output terminal portion disposed on a tip end of the current sensor passing portion; and
    a second bus bar including:
        an input terminal portion connected with the output terminal portion of the first bus bar, and
        an output terminal portion connected with a terminal of a power supply wire end, the output terminal portion being disposed on the other end side, wherein
    the first bus bar is housed in a case made of an insulating resin,
    the power supply side terminal and the current sensor passing portion are exposed from the case,
    the second bus bar is fixed to a support table made of an insulating resin, and
    the support table and the case are coupled to each other when the output terminal portion of the first bus bar and the input terminal portion of the second bus bar are connected with each other.

2. The power supply circuit structure according to claim 1, wherein
    the first bus bar has a rectangular shape,
    only the first bus bar is housed in the case,
    one end of the first bus bar protruded from the case is bent to dispose the power supply side terminal,
    the other end of the first bus bar protruded from the case is bent in an opposite direction to dispose the current sensor passing portion,
    the case housing the first bus bar is placed in an elongate space which is formed between a side face of the DC/DC converter and a side wall of a cradle,
    the support table for fixing the second bus bar has a rectangular shape, and
    the input terminal portion at the tip end of the second bus bar on the support table is connected with the bent tip end of the current sensor passing portion of the first bus bar, to place the case and the support table in parallel in the space.

3. The power supply circuit structure according to claim 1, further comprising:
    a protective cover which covers a connecting portion between the first bus bar and the second bus bar, and a connecting portion between the second bus bar and the terminal of the power supply wire end.

4. The power supply circuit structure according to claim 1, wherein
    the power supply side terminal of the first bus bar is provided with a mounting hole through which the threaded post of the DC/DC converter is to be passed, the post is connected with the power supply side terminal by passing the post through the mounting hole and fastening by a nut, and a cap portion which covers a connecting portion of the post and the power supply side terminal after the connection is provided on the case.

5. The power supply circuit structure according to claim 1, wherein a clip is protruded from one of the case housing the first bus bar and the support table for fixing the second bus bar, an engagement hole with which the clip is inserted and engaged is provided on the other of the case housing the first bus bar and the support table for fixing the second bus bar, and when the output terminal portion of the first bus bar and the input terminal portion of the second bus bar are connected with each other, the clip is inserted and engaged with the engagement hole and the case and the support table are coupled.

6. The power supply circuit structure according to claim 1, wherein a terminal portion protruded from the current sensor overlaps with the output terminal portion of the first bus bar and the input terminal portion of the second bus bar, and the three terminal portions are connected with one another.

7. A method of assembling the power supply circuit structure according to claim 1, the method comprising the steps of:

separately setting the case housing the first bus bar, and the support table to which the second bus bar is fixed, without coupling to each other, connecting the power supply side terminal of the first bus bar with the post of the DC/DC converter, attaching the current sensor passing over the current sensor passing portion from a side of the output terminal portion to the first bus bar, coupling the case and the support table to each other after the current sensor is attached, and connecting the output terminal portion of the first bust bar and the input terminal portion of the second bus bar with each other, connecting the terminal of the power supply wire end with the output terminal portion of the second bus bar, and putting a protective cover on exposed conductive portions after the electrical connection.

* * * * *